United States Patent
Qi

(10) Patent No.: US 12,286,699 B2
(45) Date of Patent: Apr. 29, 2025

(54) SCREEN TENSIONING APPARATUS FOR MASK

(71) Applicant: YUNGU (GU'AN) TECHNOLOGY CO., LTD., Hebei (CN)

(72) Inventor: Yingxu Qi, Langfang (CN)

(73) Assignee: YUNGU (GU'AN) TECHNOLOGY CO., LTD., Langfang (CN)

(*) Notice: Subject to any disclaimer, the term of this patent is extended or adjusted under 35 U.S.C. 154(b) by 636 days.

(21) Appl. No.: 17/536,595

(22) Filed: Nov. 29, 2021

(65) Prior Publication Data

US 2022/0081754 A1 Mar. 17, 2022

Related U.S. Application Data

(63) Continuation of application No. PCT/CN2020/111055, filed on Aug. 25, 2020.

(30) Foreign Application Priority Data

Nov. 28, 2019 (CN) .......................... 201922093507.7

(51) Int. Cl.
  *C23C 14/04* (2006.01)
  *B23K 20/10* (2006.01)
  *B23K 26/21* (2014.01)

(52) U.S. Cl.
  CPC ............ *C23C 14/042* (2013.01); *B23K 20/10* (2013.01); *B23K 26/21* (2015.10)

(58) Field of Classification Search
  USPC .................................. 118/720, 721, 504, 505
  See application file for complete search history.

(56) References Cited

U.S. PATENT DOCUMENTS

2017/0106472 A1   4/2017   Han

FOREIGN PATENT DOCUMENTS

| CN | 104294215 A | * | 1/2015 | ........... C23C 14/042 |
|----|-------------|---|--------|------------------------|
| CN | 107675214 A |   | 2/2018 |                        |
| CN | 107732012 A |   | 2/2018 |                        |
| CN | 108504991 A |   | 9/2018 |                        |
| CN | 109249141 A |   | 1/2019 |                        |
| CN | 109822206 A |   | 5/2019 |                        |
| CN | 211005577 U |   | 7/2020 |                        |
| JP | 10309799 A  | * | 11/1998 |                       |
| WO | WO-2019198263 A1 | * | 10/2019 | ........... C23C 14/042 |

OTHER PUBLICATIONS

English Translation CN104294215A (Year: 2015).*
English Translation CN108504991A (Year: 2018).*
English Translation CN109249141A (Year: 2019).*
English Translation JPH10309799A (Year: 1998).*
English Translation WO2019198263A1 (Year: 2019).*
International Search Report dated Nov. 5, 2020, in corresponding application PCT/CN2020/111055.

* cited by examiner

*Primary Examiner* — Yewebdar T Tadesse
(74) *Attorney, Agent, or Firm* — Maier & Maier, PLLC

(57) ABSTRACT

A screen tensioning apparatus for a mask is provided. The screen tensioning apparatus includes a supporting device, a first movable mechanism and an ultrasonic soldering device. The supporting device is disposed to support a mask framework. The ultrasonic soldering device includes an ultrasonic soldering head. The ultrasonic soldering head is fixedly connected to the first movable mechanism. The mask framework is disposed on the supporting device. The ultrasonic soldering head is disposed on one side of the mask framework facing away from the supporting device.

20 Claims, 4 Drawing Sheets

SCREEN TENSIONING APPARATUS FOR MASK

CROSS-REFERENCE TO RELATED APPLICATIONS

This application is a Continuation Application of International Patent Application PCT/CN2020/111055, filed on Aug. 25, 2020, which claims priority to Chinese Patent Application No. 201922093507.7 filed with the CNIPA on Nov. 28, 2019, the disclosures of which are incorporated herein by reference in their entireties.

TECHNICAL FIELD

The present application relates to the technical field of mask fabrication, for example, a screen tensioning apparatus for a mask.

BACKGROUND

With the rapid development of science and technology, people are paying more attention to the clarity and performance of details of display. Therefore, the resolution of a display panel needs to be improved. However, the higher the resolution of the display panel is, the thinner the thickness of a mask strip used in fabrication of the display panel is. As a result, a wrinkle is easy to occur when the mask strip is soldered to a mask framework, thus increasing the risks of pseudo soldering of the mask strip and a color cast and a color mixing of the display panel.

SUMMARY

The present application provides a screen tensioning apparatus for a mask for reducing a wrinkle of the mask and thus improving the accuracy and the service life of the mask.

In a first aspect, embodiments of the present application provide a screen tensioning apparatus for a mask. The screen tensioning apparatus for a mask includes a supporting device configured to support a mask framework, a first movable mechanism and an ultrasonic soldering device. The ultrasonic soldering device includes an ultrasonic soldering head. The ultrasonic soldering head is fixedly connected to the first movable mechanism. The mask framework is disposed on the supporting device and the ultrasonic soldering head is disposed on one side of the mask framework facing away from the supporting device.

Moreover, in the technical solution of the present application, the screen tensioning apparatus for a mask is disposed to include the ultrasonic soldering device so that the mask strip is soldered to the mask framework by a high-frequency vibration wave. The ultrasonic soldering enables, by pressure application, a surface of the mask strip and a surface of the mask framework to rub against each other to bring about a fusion between the molecular layers; therefore, a soldering surface of the mask strip and a soldering surface of the mask framework can be tightly attached to each other. In this manner, a wrinkle phenomenon and pseudo soldering of the mask strip are reduced and the soldering quality of the mask strip and the mask framework is improved. Moreover, the pixel position alaccuracy (PPA) of an opening on the mask strip is improved and the vapor deposition yield of the mask used for vapor deposition is improved. Thus, mask rework is greatly reduced, thereby not only reducing the material cost and labor cost incurred by the mask rework, but also saving the time cost. Moreover, since the soldering surface of the mask strip and the soldering surface of the mask framework are tightly attached to each other, solder disconnection can be reduced when the mask is evaporated and cleaned for many times, thereby greatly improving the service life of the mask. Additionally, the high-frequency vibration wave is available during the ultrasonic soldering process, so the requirement for the flatness of the surface of the soldered metal is relatively low during the ultrasonic soldering. In the case where the surface of the soldered metal is oxidized or has micro-particles, the high-frequency vibration wave can still enable the surface of the mask strip and the surface of the mask framework to rub against each other to bring about a fusion between the molecular layers, enabling the mask strip to be soldered to the mask framework. Moreover, a local temperature rise is relatively small during the ultrasonic soldering process; therefore, the surface of the soldered metal is not damaged, so no slag and metal particle are generated and splashed.

DETAILED DESCRIPTION

Figure 1:
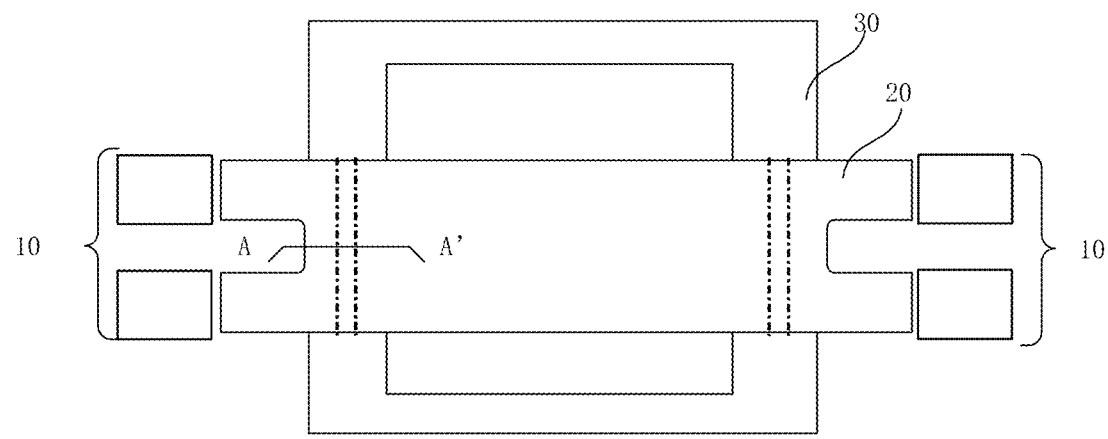
FIG. 1 is a schematic diagram illustrating the structure of a mask during a laser soldering process.
Figure 2:
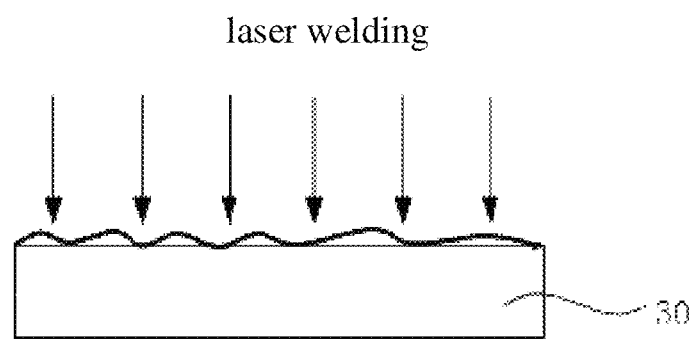
FIG. 2 is a section view taken along AN of FIG. 1.

The preparation of an Organic Light Emitting Diode (OLED) display usually uses vapor deposition to form layers. When a light-emitting layer of the OLED display plane is fabricated, a mask can be configured to evaporate the materials of the three primary colors of red, green and blue to different sub-pixel areas respectively to make the colorization display implemented. Thus, the position accuracy of opening on the mask needs to be ensured so that the openings on the mask correspond to the sub-pixel areas of the OLED display plane one-to-one so as to avoid the color mixing in the same sub-pixel area when multi-color materials are evaporated. During the screen tensioning process of the mask, a clamping jaw on the screen tensioning apparatus stretches a mask strip to make the screen tensioning of the mask strip implemented so that the mask strip is placed on a mask framework and is soldered by laser, and the mask strip is secured to the mask framework so as to form a mask for vapor deposition. FIG. 1 is a schematic diagram illustrating the structure of a mask during a laser soldering process and FIG. 2 is a section view taken along AA of FIG. 1. As shown in FIGS. 1 to 2, when a clamping jaw 10 stretches a mask strip 20, the mask strip 20 is easy to wrinkle due to an uneven force. A wrinkle may extend to an vapor deposition effective region of the mask strip 20, resulting in the decrease of PPA of the opening on the mask strip 20. As a result, a phenomenon such as a color mixing is easy to occur. Additionally, during the laser soldering process, if the mask strip 20 and a mask framework 30 are not tightly attached to each other, pseudo soldering is easy to occur. As a result, the soldering firmness between the mask strip 20 and the mask framework 30 is rather low, which may not only reduce the PPA of the opening on the mask strip 20, but may also reduce the yield of the mask for vapor deposition. Moreover, as the mask for vapor deposition is used repeatedly, solder disconnection occurs after the mask for vapor deposition is cleaned for many times. As a result, the PPA of the opening on the mask strip 20 is decreased and thus the service life of the mask is reduced.

Figure 3:
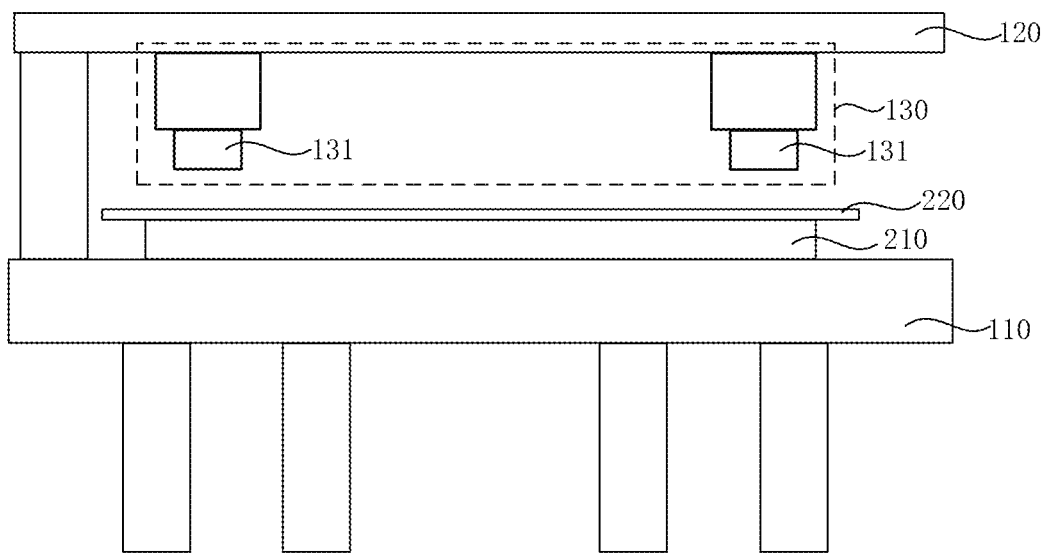
FIG. 3 is a schematic diagram illustrating the structure of a screen tensioning apparatus for a mask according to an embodiment of the present application.

The present application provides a screen tensioning apparatus for a mask. FIG. 3 is a schematic diagram illustrating the structure of a screen tensioning apparatus for a mask according to an embodiment of the present application. As shown in FIG. 3, the screen tensioning apparatus includes a supporting device 110, a first movable mechanism 120 and an ultrasonic soldering device 130. The supporting device 110 is configured to support the mask framework 210. The ultrasonic soldering device 130 includes an ultrasonic soldering head 131. The ultrasonic soldering head 131 is fixedly connected to the first movable mechanism 120. The mask framework 210 is disposed on the supporting device 110 and the ultrasonic soldering head 131 is disposed on one side of the mask framework 210 facing away from the supporting device 110.

Exemplarily, the supporting device 110 includes a supporting platform. The supporting device 110 is configured to support the mask framework 210. A mask strip 220 is disposed on the mask framework 210. A mask for vapor deposition is formed by the mask strip 220 soldered to the mask framework 210. During a soldering process, the mask strip 220 is disposed on the mask framework 210 after alignment. The first movable mechanism 120 drives the ultrasonic soldering device 130 to move such that the ultrasonic soldering head 131 faces a soldering region of the mask framework 210. The ultrasonic soldering head 131 is configured to, under control of the first movable mechanism 120, solder the mask strip 220 on the mask framework 210 to make the mask strip 220 soldered to the mask framework 210 in the soldering region on the mask framework 210 to form the mask for vapor deposition.

During the soldering process, the ultrasonic soldering head 131 generates a high-frequency vibration wave. Exemplarily, the high-frequency vibration wave may be 20 kHz to 80 kHz vibration wave. The high-frequency wave is transmitted to the mask strip 220 and the mask framework 210. With pressure application, a surface of the mask strip 220 and a surface of the mask framework 210 rub against each other to bring about a fusion between the molecular layers so that the mask strip 220 soldered to the mask framework 210 is implemented. The ultrasonic soldering enables, by pressure application, the surface of the mask strip 220 and the surface of the mask framework 210 to rub against each other to bring about a fusion between the molecular layers; therefore, a soldering surface of the mask strip 220 and a soldering surface of the mask framework 210 can be tightly attached to each other. In this manner, a wrinkle phenomenon and pseudo soldering of the mask strip 220 can be reduced and the soldering quality of the mask strip 220 and the mask framework 210 can be improved. Moreover, the PPA of the opening on the mask strip 220 is improved and the vapor deposition yield of the mask used for vapor deposition is improved. Thus, mask rework is greatly reduced, thereby not only reducing the material cost and labor cost incurred by the mask rework, but also saving the time cost. Exemplarily, the time required by rework of each mask is about 5 hours after mass production. If calculated by the number of reworks required to reduce 10 masks per month, the mask rework time can be saved about 50 hours per month.

Moreover, since the soldering surface of the mask strip 220 and the soldering surface of the mask framework 210 are tightly attached to each other, solder disconnection can be reduced when the mask is evaporated and cleaned for many times, thereby greatly improving the service life of the mask. Additionally, the high-frequency vibration wave is available during the ultrasonic soldering process, so the requirement for the flatness of the surface of the soldered metal is relatively low. In the case where the surface of the soldered metal is oxidized and has micro-particles, the high-frequency vibration wave can still enable the surface of the mask strip 220 and the surface of the mask framework 210 to rub against each other to bring about a fusion between the molecular layers, enabling the mask strip 220 to be soldered to the mask framework 210. Moreover, the local temperature rise is relatively small during the ultrasonic soldering process; therefore, the surface of the soldered metal is not damaged, so no slag and metal particle are generated and splashed.

Figure 4:
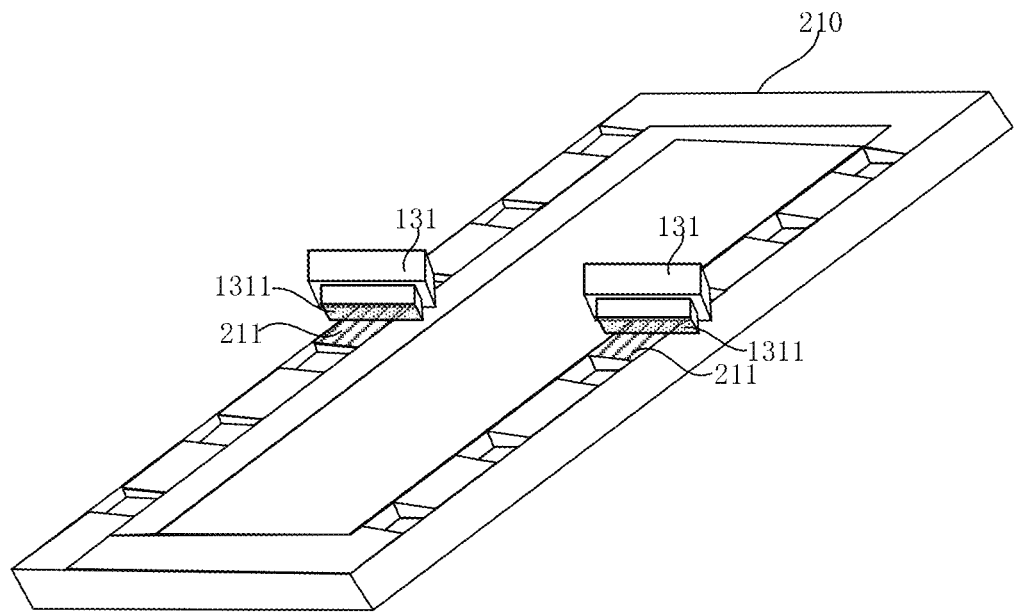
FIG. 4 is a schematic diagram illustrating the structure of a mask during an ultrasonic soldering process according to an embodiment of the present application.

FIG. 4 is a schematic diagram illustrating the structure of a mask during an ultrasonic soldering process according to an embodiment of the present application. As shown in FIG. 4, the mask framework 210 includes a soldering region 211. The ultrasonic soldering head 131 includes a soldering surface 1311. An area of the soldering surface 1311 is larger than an area of the soldering region 211.

Exemplarily, during the ultrasonic soldering process, the soldering surface 1311 of the ultrasonic soldering head 131 faces the soldering region 211 of the mask framework 210. When the soldering surface 1311 makes contact with the soldering region 211, the ultrasonic soldering head 131 generates the high-frequency vibration wave and a pressure through the soldering surface 1311 so that a mask strip on the soldering region 211 is pressurized to be attached to the soldering region 211 and is soldered to the soldering region 211 under the action of the high-frequency vibration wave at the same time. Since the area of the soldering surface 1311 is larger than the area of the soldering region 211, during the soldering process, the mask strip on the soldering region 211 can be evenly soldered under the action of the high-frequency vibration wave and the pressure of the soldering surface 1311 at the same time. In this manner, the soldering efficiency can be improved and the soldering yield can be improved at the same time, thus reducing a wrinkle and pseudo soldering during a soldering process.

Referring to FIG. 4, the mask framework 210 includes two soldering regions 211. Two ultrasonic soldering heads 131 corresponding to the soldering regions 211 may also be provided. During the soldering process, the two ultrasonic soldering heads 131 solder the mask strip at the same time so that two ends of the mask strip are soldered to the mask framework 210 at the same time and thus the mask strip soldered to the mask framework is implemented so as to form a mask.

Figure 5:
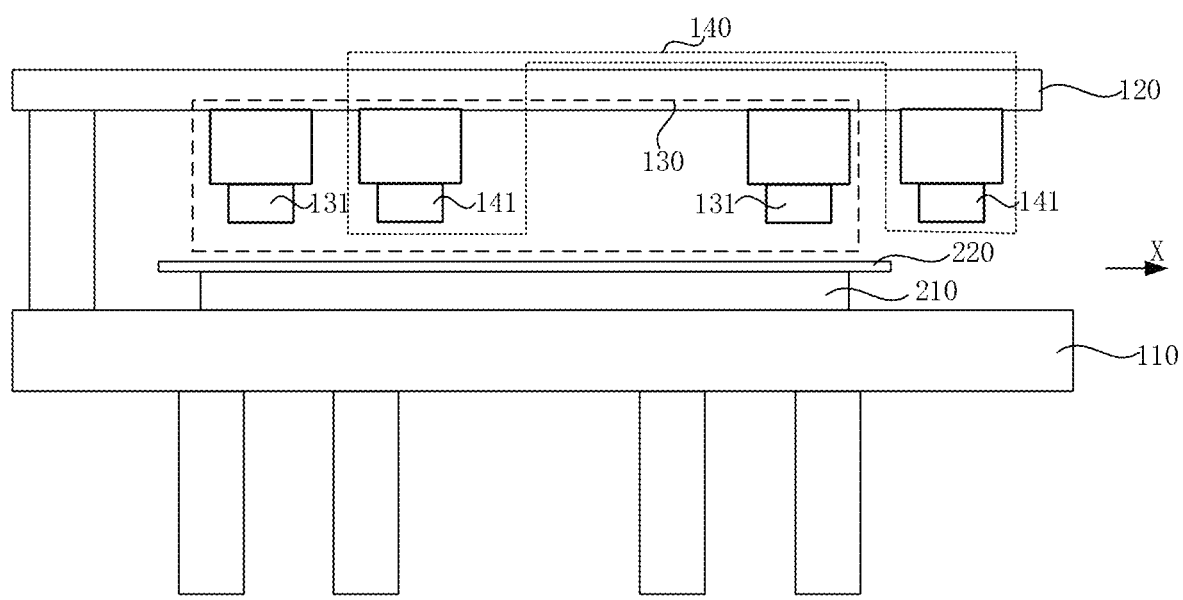
FIG. 5 is a schematic diagram illustrating the structure of another screen tensioning apparatus for a mask according to an embodiment of the present application.

FIG. 5 is a schematic diagram illustrating the structure of another screen tensioning apparatus for a mask according to an embodiment of the present application. As shown in FIG. 5, the screen tensioning apparatus also includes a laser soldering device 140. The laser soldering device 140 includes a laser soldering head 141. The laser soldering head 141 is fixedly connected to the first movable mechanism 120 and is disposed on one side of the mask framework 210 facing away from the supporting device 110.

Exemplarily, after the mask strip 220 is soldered to the mask framework 210 by the ultrasonic soldering head 131, the laser soldering head 141 may be used to re-solder the mask strip 220 to the mask framework 210 so that the soldering firmness of the mask strip 220 and the mask framework 210 can be strengthened on the basis of avoiding a wrinkle and pseudo soldering in the soldering process.

The laser soldering head 141 is fixedly connected to the first movable mechanism 120. Therefore, during a laser soldering process, the first movable mechanism 120 is configured to drive the laser soldering head 141 to move such that when the laser soldering head 141 faces a soldering region on the mask framework 210, under control of the first movable mechanism 120, the laser soldering head 141 solders the mask strip 220 on the mask framework 210 so as to make the mask strip 220 re-soldered to the mask framework 210 in the soldering region.

Referring to FIG. 5, along a length direction X of the mask framework 210, the ultrasonic soldering device 130 and the laser soldering device 140 are disposed side by side.

Exemplarily, along the length direction X of the mask framework 210, the ultrasonic soldering device 130 and the laser soldering device 140 are disposed side by side. After the mask strip 220 is soldered to the mask framework 210 by the ultrasonic soldering device 130, the first movable mechanism 120 may move only along the length direction X of the mask framework 210. In this manner, the ultrasonic soldering device 130 corresponding to the soldering region of the mask framework 210 can be quickly switched to the laser soldering device 140 and the alignment of the laser soldering device 140 with the soldering region along a width direction of the mask framework 210 can be avoided. Thus, the alignment difficulty of the laser soldering device 140 can be reduced.

Figure 6:
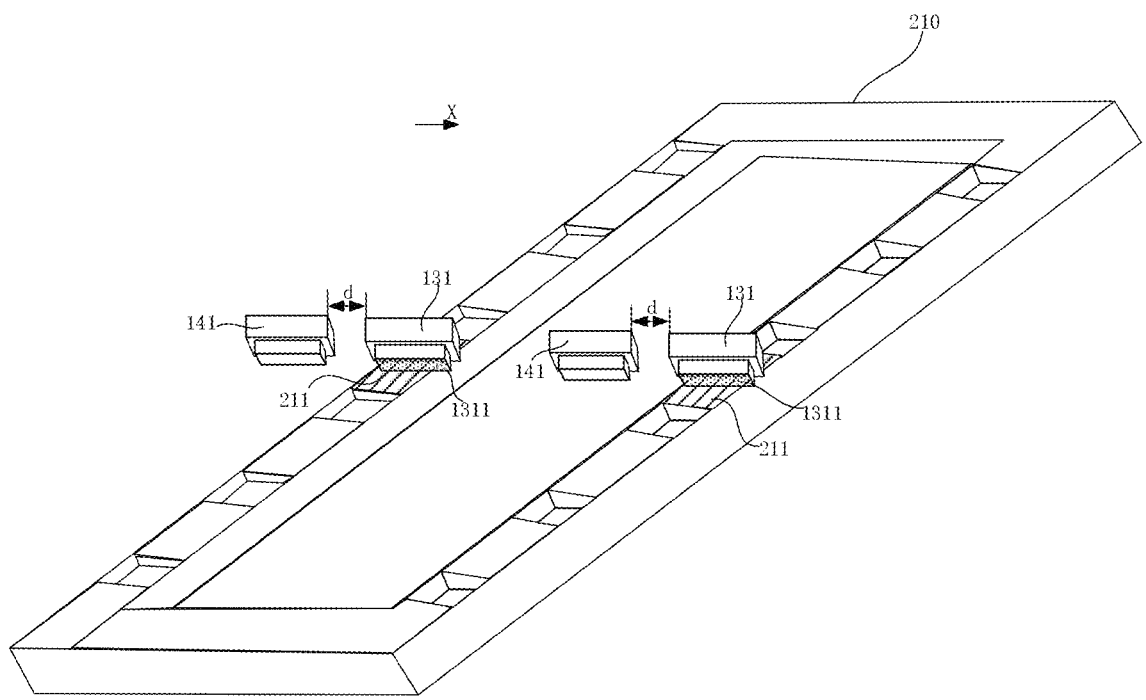
FIG. 6 is a schematic diagram illustrating the structure of a mask during a soldering process according to an embodiment of the present application.

FIG. 6 is a schematic diagram illustrating the structure of a mask during a soldering process according to an embodiment of the present application. As shown in FIG. 6, two ultrasonic soldering heads 131 and two laser soldering heads 141 are provided. Along the length direction X of the mask framework 210, two opposite borders of the mask framework 210 each include the soldering region 211. The distance between the soldering region 211 on one of the two opposite borders and the soldering region 211 on the other of the two opposite borders is the first distance. The distance between the two ultrasonic soldering heads 131 is the first distance and the distance between the two laser soldering heads 141 is also the first distance.

Exemplarily, the soldering region 211 of the mask framework 210 is disposed to solder a mask strip. When the mask strip is soldered, one mask strip corresponds to two soldering regions 211. Two ends of the mask strip are soldered to the two soldering regions of the mask framework 210. Two ultrasonic soldering heads 131 and two laser soldering heads 141 are provided. Each of the soldering regions 211 of the mask framework 210 corresponds to one ultrasonic soldering head 131 and one laser soldering head 141. During the ultrasonic soldering process, the ultrasonic soldering head 131 corresponding to the each of the soldering regions 211 directly faces the each of the soldering regions 211 so that the ultrasonic soldering of all the soldering regions 211 is implemented. During the laser soldering process, the laser soldering head 141 corresponding to the each of the soldering regions 211 directly faces the each of the soldering regions 211 so that the laser soldering of all the soldering regions 211 is implemented. Therefore, the soldering efficiency of the mask strip and the mask framework 210 can be improved by the disposition of two ultrasonic soldering heads 131 and two laser soldering heads 141.

It is to be noted that, along the length direction X of the mask framework 210, the distance between the two ultrasonic soldering heads 131 may be equal to the distance between the two corresponding soldering regions 211 of the mask framework 210. During the ultrasonic soldering process, when one of the two ultrasonic soldering heads 131 is accurately aligned with the corresponding soldering region 211, the two ultrasonic soldering heads 131 can be simultaneously aligned with the two soldering regions 211 and the two soldering regions can be simultaneously soldered. Similarly, the distance between the two laser soldering heads 141 may be equal to the distance between the two corresponding soldering regions 211 of the mask framework 210. During the laser soldering process, when one of the two laser soldering heads 141 is accurately aligned with the corresponding soldering region 211, the two laser soldering heads 141 can be simultaneously aligned with the two soldering regions 211 and the two soldering regions 211 can be simultaneously soldered.

Additionally, the distance d between the ultrasonic soldering head 131 and the laser soldering head 141 corresponding to the same soldering region 211 is equal to the distance d between the ultrasonic soldering head 131 and the laser soldering head 141 corresponding to the other soldering region 211. When the ultrasonic soldering process is switched to the laser soldering process, after the distance d between the ultrasonic soldering head 131 and the laser soldering head 141 corresponding to the same soldering region 211 is moved along the length direction X of the mask framework 210, the laser soldering heads 141 corresponding to the two soldering regions 211 each can correspond to the soldering region 211, thus preparing for the laser soldering process.

Referring to FIG. 6, the mask framework 210 includes a soldering region 211. Along the length direction X of the mask framework 210, the distance d between the ultrasonic soldering 131 and the laser soldering head 141 is greater than or equal to the width of the soldering region 211.

Exemplarily, the distance d between the ultrasonic soldering head 131 and the laser soldering head 141 is disposed to be greater than or equal to the width of the soldering region 211. When the ultrasonic soldering head 131 faces the soldering region 211, the laser soldering head 141 is outside of the soldering region 211 and the ultrasonic soldering head 131 is completely attached to the soldering region 211 so as to perform the ultrasonic soldering on the soldering region 211 and to prevent the laser soldering head 141 from affecting the soldering of the ultrasonic soldering head 131. Similarly, when the laser soldering head 141 faces the soldering region 211, the ultrasonic soldering head 131 is outside of the soldering region 211 so as to prevent the ultrasonic soldering head 131 from affecting the laser soldering.

In one embodiment, the first movable mechanism 120 includes at least one group having a first movable arm and a first driving unit. In each group, the first driving unit is connected to the first movable arm and is configured to drive the first movable arm in the same group to move.

Exemplarily, the first driving unit may include a motor and a micro-controller. The micro-controller controls the rotation direction and the rotation rate of the motor. The first movable arm may be a mechanical arm moving along an orbit. When the first movable mechanism controls an ultrasonic soldering head and a laser soldering head to move, the micro-controller controls the rotation direction and rotation rate of the motor and drives the ultrasonic soldering head and the laser soldering head to move through the first movable arm. Exemplarily, the ultrasonic soldering head corresponds to one group of the first movable arm and the first driving unit and the laser soldering head corresponds to the other group of the first movable arm and the first driving unit. The first driving unit controls the ultrasonic soldering head and the laser soldering head to move through the first movable arm so that the ultrasonic soldering head or the laser soldering head can correspond to a soldering region at different times.

Figure 7:
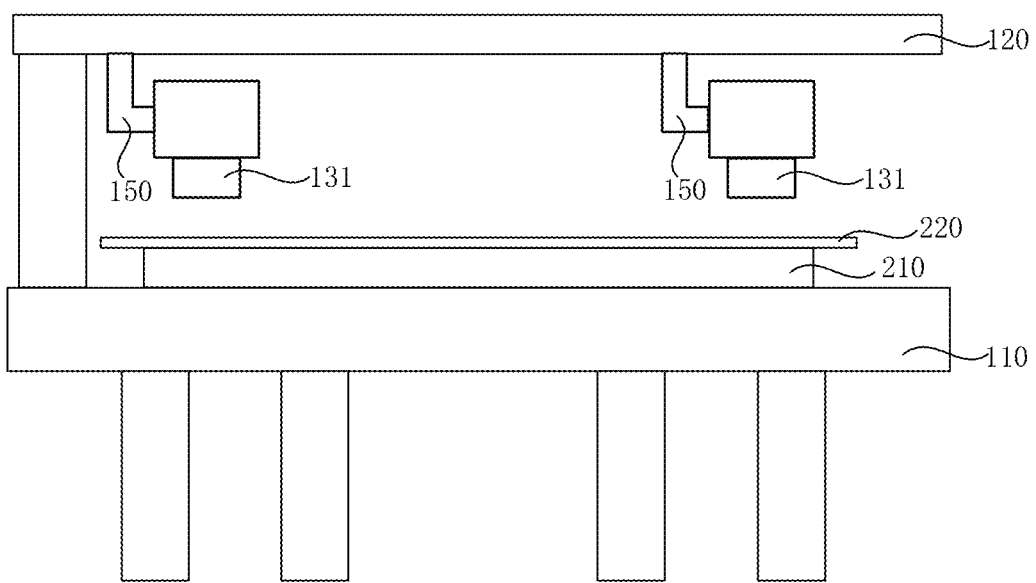
FIG. 7 is a schematic diagram illustrating the structure of another screen tensioning apparatus for a mask according to an embodiment of the present application.

FIG. 7 is a schematic diagram illustrating the structure of another screen tensioning apparatus for a mask according to an embodiment of the present application. As shown in FIG. 7, the screen tensioning apparatus also includes a second movable mechanism 150. The ultrasonic soldering head 131 and the laser soldering head 141 are fixedly connected to the first movable mechanism 120 through the second movable mechanism 150. A moving step length of the second movable mechanism 150 is less than a moving step length of the first movable mechanism 120.

Exemplarily, a plurality of second movable mechanisms 150 may be provided to drive the ultrasonic soldering head 131 and the laser soldering head 141 to move respectively. In the case where the screen tensioning apparatus includes the second movable mechanism 150, the first movable mechanism 120 may be a fast-movable mechanism. The moving step length of the second movable mechanism 150 is less than the moving step length of the first movable mechanism 120. That is, the second movable mechanism 150 may be a high-accuracy movable mechanism relative to the first movable mechanism 120. When the ultrasonic soldering head 131 and the laser soldering head 141 are moved, the ultrasonic soldering head 131 or the laser soldering head 141 can be fast moved to the vicinity of a target position through the first movable mechanism 120. Then, the ultrasonic soldering head 131 or the laser soldering head 141 is accurately moved to the target position through the second movable mechanism 150 so that the fast and accurate movement of the ultrasonic soldering head 131 and the laser soldering head 141 can be implemented and thus the soldering efficiency of the mask strip 220 and mask framework 210 can be improved.

Exemplarily, the second movable mechanism includes at least one group having a second movable arm and a second driving unit. In each group, the second driving unit is connected to the second movable arm and is configured to drive the second movable arm in the same group to move.

Exemplarily, the second driving unit may include a motor and a micro-controller. The micro-controller controls the rotation direction and the rotation rate of the motor. The second movable arm may be a mechanical arm moving along an orbit. When the second movable mechanism controls an ultrasonic soldering head and a laser soldering head to move, the micro-controller controls the rotation direction and rotation rate of the motor and drives the ultrasonic soldering head and the laser soldering head to move through the second movable arm. Exemplarily, the second movable mechanism includes two groups each having the second movable arm and the second driving unit. The ultrasonic soldering head corresponds to the second movable arm and the second driving unit in one of the two groups and the laser soldering head corresponds to the second movable arm and the second driving unit in the other of the two groups. The second driving unit controls the ultrasonic soldering head and the laser soldering head to move through the second movable arm so that the ultrasonic soldering head or the laser soldering head can correspond to a soldering region at different times.

It is to be noted that the number of groups of the first movable mechanism may be equal to the number of the groups of the second movable mechanism so that each ultrasonic soldering head and each laser soldering head can be configured to move through the cooperation of the first movable mechanism and the second movable mechanism.

Figure 8:
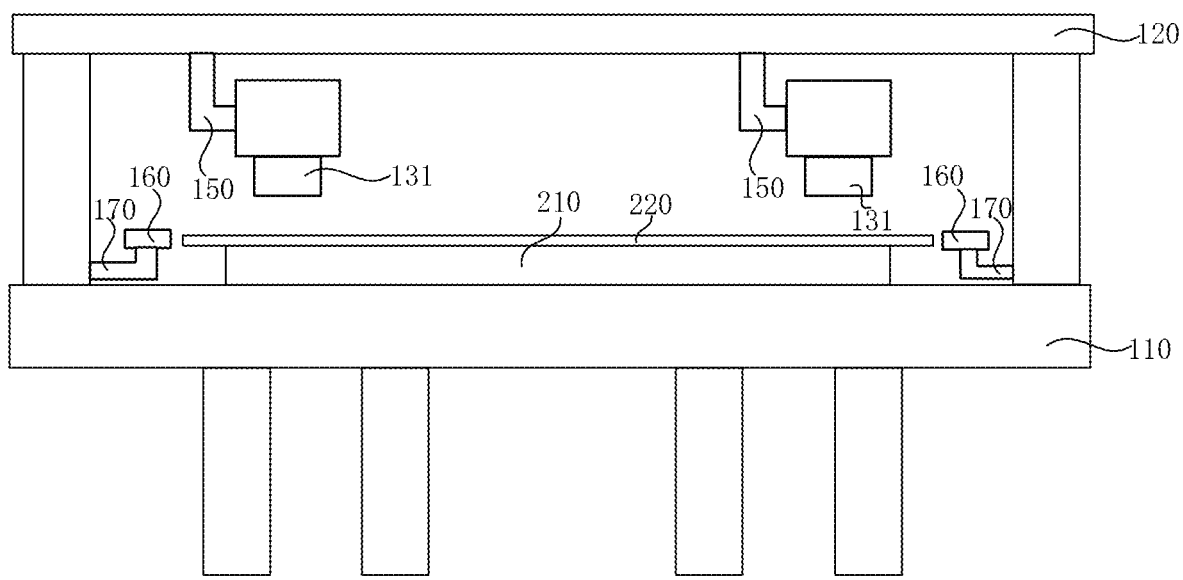
FIG. 8 is a schematic diagram illustrating the structure of another screen tensioning apparatus for a mask according to an embodiment of the present application.

FIG. 8 is a schematic diagram illustrating the structure of another screen tensioning apparatus for a mask according to an embodiment of the present application. As shown in FIG. 8, the screen tensioning apparatus also includes a clamping jaw 160 and a third movable mechanism 170. The clamping jaw 160 is connected to the third movable mechanism 170. The clamping jaw 160 is driven by the third movable mechanism 170 to clamp the mask strip 220 on the mask framework 210.

Exemplarily, each of the two ends of the mask strip 220 includes two clamping jaws 160. The two clamping jaws at the same end are symmetrical relative to the center line extending along the length direction of the mask strip 220. The clamping jaws 160 at different ends are symmetrical relative to the center line extending along the width direction of the mask strip 220. Therefore, when the clamping jaw 160 clamps the mask strip 220, the force exerted on the mask strip 220 is even so that the probability that a wrinkle occurs on the mask strip 220 is reduced. The third movable mechanism 170 may drive the clamping jaw 160 to move and clamp. During the screen tensioning process, the third movable mechanism 170 controls the clamping jaw 160 to move to the two ends of the mask strip 220 and clamp the mask strip 220 so that the screen tensioning of the mask strip 200 can be implemented.

Similarly, the third movable mechanism 170 may include two groups having a third movable arm and a third driving unit. In each group, the third driving unit is connected to the third movable arm and is configured to drive the third movable arm in the same group to move.

What is claimed is:

1. A screen tensioning apparatus for a mask, comprising:
   a supporting device configured to support a mask framework;
   a first movable mechanism;
   an ultrasonic soldering device comprising an ultrasonic soldering head, wherein the ultrasonic soldering head is fixedly connected to the first movable mechanism, the mask framework is disposed on the supporting device, and the ultrasonic soldering head is disposed on one side of the mask framework facing away from the supporting device; and
   a laser soldering device, wherein the ultrasonic soldering device and the laser soldering device are disposed side by side along a length direction of the mask framework.

2. The screen tensioning apparatus of claim 1, wherein the mask framework comprises a soldering region, and the first movable mechanism is configured to drive the ultrasonic soldering device to move to make the ultrasonic soldering head face the soldering region of the mask framework.

3. The screen tensioning apparatus of claim 2, wherein a mask strip is disposed on the mask framework, and the ultrasonic soldering head is configured to, under control of the first movable mechanism, solder the mask strip on the mask framework to make the mask strip soldered to the mask framework in the soldering region of the mask framework to form a mask for vapor deposition.

4. The screen tensioning apparatus of claim 2, wherein the ultrasonic soldering head comprises a soldering surface and, an area of the soldering surface is larger than an area of the soldering region.

5. The screen tensioning apparatus of claim 1, wherein the laser soldering device comprises a laser soldering head fixedly connected to the first movable mechanism and is disposed on the one side of the mask framework facing away from the supporting device.

6. The screen tensioning apparatus of claim 5, wherein the mask framework comprises a soldering region, and a distance between the ultrasonic soldering head and the laser soldering head is greater than or equal to a width of the soldering region along a length direction of the mask framework.

7. The screen tensioning apparatus of claim 6, wherein the ultrasonic soldering head comprises two ultrasonic soldering heads, the laser soldering head comprises two laser soldering heads, and, along the length direction of the mask framework, two opposite borders of the mask framework respectively comprise the soldering region, a distance between soldering regions on two opposite borders is a first distance, a distance between the two ultrasonic soldering heads is the first distance, and a distance between the two laser soldering heads is the first distance.

8. The screen tensioning apparatus of claim 6, wherein the first movable mechanism comprises at least one group having a first movable arm and a first driving unit, and the first driving unit in each group is connected to the first movable arm in a same group and is configured to drive the first movable arm in the same group to move.

9. The screen tensioning apparatus of claim 8, further comprising:
a second movable mechanism, wherein the ultrasonic soldering head and the laser soldering head are fixedly connected to the first movable mechanism through the second movable mechanism, and a moving step length of the second movable mechanism is less than a moving step length of the first movable mechanism.

10. The screen tensioning apparatus of claim 9, wherein the second movable mechanism comprises at least one group having a second movable arm and a second driving unit, and the second driving unit in each group is connected to the second movable arm in a same group and is configured to drive the second movable arm in the same group to move.

11. The screen tensioning apparatus of claim 10, wherein the second movable mechanism comprises two groups each having the second movable arm and the second driving unit, the ultrasonic soldering head corresponds to the second movable arm and the second driving unit in one group of the two groups, and the laser soldering head corresponds to the second movable arm and the second driving unit in another group of the two groups.

12. A screen tensioning apparatus for a mask, comprising:
a supporting device configured to support a mask framework;
a first movable mechanism;
an ultrasonic soldering device comprising an ultrasonic soldering head, wherein the ultrasonic soldering head is fixedly connected to the first movable mechanism, the mask framework is disposed on the supporting device, and the ultrasonic soldering head is disposed on one side of the mask framework facing away from the supporting device; and
a clamping jaw and a third movable mechanism, wherein the clamping jaw is connected to the third movable mechanism and is configured to, under the driving of the third movable mechanism, clamp a mask strip on the mask framework.

13. The screen tensioning apparatus of claim 12, wherein the mask framework comprises a soldering region, and the first movable mechanism is configured to drive the ultrasonic soldering device to move to make the ultrasonic soldering head face the soldering region of the mask framework.

14. The screen tensioning apparatus of claim 13, wherein a mask strip is disposed on the mask framework, and the ultrasonic soldering head is configured to, under control of the first movable mechanism, solder the mask strip on the mask framework to make the mask strip soldered to the mask framework in the soldering region of the mask framework to form a mask for vapor deposition.

15. The screen tensioning apparatus of claim 13, wherein the ultrasonic soldering head comprises a soldering surface and an area of the soldering surface is larger than an area of the soldering region.

16. The screen tensioning apparatus of claim 12, wherein the laser soldering device comprises a laser soldering head, and wherein the laser soldering head is fixedly connected to the first movable mechanism and is disposed on the one side of the mask framework facing away from the supporting device.

17. The screen tensioning apparatus of claim 16, wherein the mask framework comprises a soldering region, and a distance between the ultrasonic soldering head and the laser soldering head is greater than or equal to a width of the soldering region along a length direction of the mask framework.

18. The screen tensioning apparatus of claim 17, wherein the ultrasonic soldering head comprises two ultrasonic soldering heads, the laser soldering head comprises two laser soldering heads, and, along the length direction of the mask framework, two opposite borders of the mask framework respectively comprise the soldering region, a distance between soldering regions on two opposite borders is a first distance, a distance between the two ultrasonic soldering heads is the first distance, and a distance between the two laser soldering heads is the first distance.

19. The screen tensioning apparatus of claim 17, wherein the first movable mechanism comprises at least one group having a first movable arm and a first driving unit, and the first driving unit in each group is connected to the first movable arm in a same group and is configured to drive the first movable arm in the same group to move.

20. The screen tensioning apparatus of claim 19, further comprising:
a second movable mechanism, wherein the ultrasonic soldering head and the laser soldering head are fixedly connected to the first movable mechanism through the second movable mechanism, and a moving step length of the second movable mechanism is less than a moving step length of the first movable mechanism.

* * * * *